Aug. 29, 1961 R. E. HALL 2,998,362

METHOD OF SELECTIVELY ELECTROLYTICALLY ETCHING SEMICONDUCTOR SILICON MATERIALS

Filed Oct. 16, 1958

RODERIC E. HALL INVENTOR.

BY EZEKIEL WOLF, WOLF + GREENFIELD

HIS ATTORNEYS.

2,998,362

METHOD OF SELECTIVELY ELECTROLYTICALLY ETCHING SEMICONDUCTOR SILICON MATERIALS

Roderic E. Hall, Waban, Mass., assignor, by mesne assignments, to Transitron Electronic Corporation, Wakefield, Mass., a corporation of Delaware Filed Oct. 16, 1958, Ser. No. 767,703
5 Claims. (Cl. 204—143)

The present invention relates to a means and method of etching bars, dice or slices of silicon layers having transverse alternate sections of donor and acceptor impurities.

In the process of manufacturing transistors, thyratons and diodes of semiconductor material, it is often desirable to have adjacent sections of N and P type semiconductor materials of different diameters. Thus, for example, in the manufacture of N-P-N or P-N-P transistors it is desirable to form at least one end section of a smaller diameter than the center section, thus leaving an annular flange-like extension of the center section extending outwardly beyond the edges of the end section in question. This annular flange-like section provides an area onto which a contact may be made. In the case of a transistor, this forms the base electrode. Such contacts may be made in a very simple manner even though this base connector does come quite close to the end section.

Thus, it is an object of the present invention to provide a means for processing bars having successive layers or sections of donor and acceptor semiconductor materials in such a manner as to provide an exposed surface on one layer which forms a planar extension of the junction of the two layers.

Further, it is an object of the present invention to provide a method of forming such a planar extension in a simple and efficient manner.

The present invention also provides means by which a planar extension or an annular flange of the type described may be formed as a reference plane for the further grinding or removing of excess portions of the transistor or diode to be formed.

A further object of the present invention is to provide an efficient and effective etching means in which undesired portions of a bar of successive layers of donor and acceptor semiconductor materials may readily be removed in a controlled and efficient manner.

The present invention also provides a novel chemical composition adapted to electrochemically remove undesirable portions of semiconductor material from a bar, die or slice (hereinafter referred to, for convenience, as a "piece") of N and P type semiconductor materials.

These and other objects of the present invention will be more clearly understood when considered in conjunction with the accompanying drawings in which.

The present invention is adapted for etching of pieces of alternate layers of N and P type semiconductor material in alternate and adjacent relation. Thus, the present invention is designed for treatment of pieces of semiconductor materials used in the manufacture of N-P-N and P-N-P transistors as well as diodes and rectifiers of semiconductor materials. For convenience, the invention will be described in conjunction with the processing of an N-P-N transistor, bearing in mind however that the same methods are applicable to other types of transistors as well as diodes and rectifiers.

Figure 1:
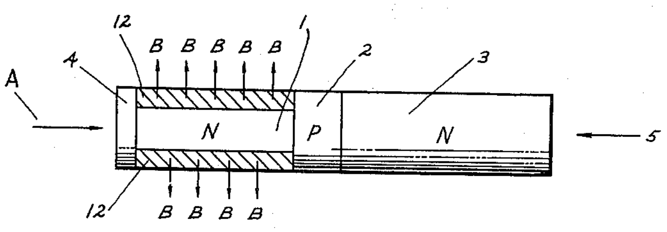
FIGURE 1 represents schematically layers of semiconductor material adapted for use in the present invention.
Figure 3:
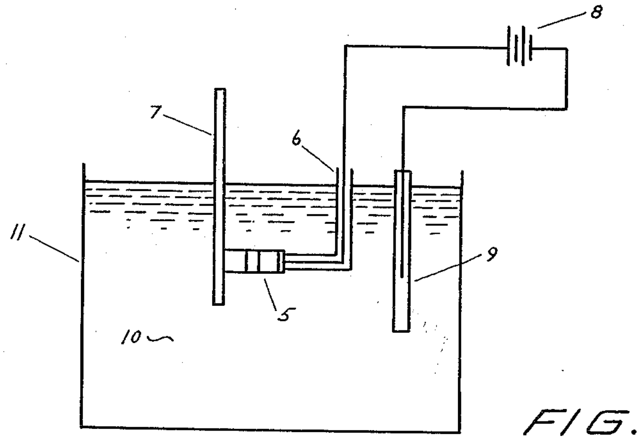
FIGURE 3 represents a schematic arrangement of a means by which the method of the present invention may be carried out.

As illustrated in FIGURE 1, a piece of semiconductor material having successive sections 1, 2 and 3 respectively of N-P-N types of semiconductor material arranged in adjacent and intimate relation. This piece may be formed in any of the conventional methods heretofore known which include the grown method, the grown diffused method, the alloyed method and the solid state diffusion method of forming successive junctions of electrically contrasting semiconductor material.

As a preliminary and preferable step a metallic conductive button, preferably of platinum with gold or of any material or combinations which will form a nonrectifying contact is alloyed or fused to section 1, the button being indicated at 4. This alloying may be accomplished in a vacuum, reducing atmosphere or inert atmosphere furnace at a temperature of 700° or other temperature consistent with materials used.

The piece, as thus treated and generally indicated at 5, is then secured between the electrode 6 and supporting dielectric plate 7. The electrode 6 is preferably formed of platinum coated except at the end with a layer of dielectric material, nonreactive with the surrounding fluid. The particular material forming the electrodes is not a critical part of operation as long as it is not attacked or "etched" rapidly in the process. This dielectric material is preferably "Teflon" or "Kel-F" and is adapted to withstand the corrosive action of the solution (to be described). The plate 7 is preferably also made of Kel-F or Teflon and is suitably secured in a manner such as to rigidly hold the piece 5 between it and the submerged end of the electrode 6 with the electrode contacting the button 4. The conductive portions of the electrode 6 should preferably not be exposed to the solution except where special shaping is desired. A D.C. power source 8 has one terminal connected to the other end of the electrode 6 while the other terminal of power source 8 is connected to the electrode 9 which is preferably formed of carbon or platinum. These elements 5, 6, 7 and 9 are immersed in the fluid 10 contained in the container 11, which container is of a relatively inert dielectric material.

The solution 10 may be formed of a composition of citric acid, HF acid and water. An ideal solution comprises

| | |
|---|---|
| Citric acid | 20 grams (powder form) |
| Hydrofluoric acid | 120 cc. 48% concentration |
| Water | sufficient added to the acids to make 400 cc. liquid solution. |

This particular solution may be varied. As for example, by varying the amount of water added to make from between 200 and 400 cc. solution. As alternately stated, the solution 10 may be varied by varying, in a 400 cc. solution, the HF acid from 60 to 180 cc. and the citric acid from 20 to 40 grams.

Other organic acids, with an ionization constant of between $10^{-2}$ and $10^{-5}$, e.g., acetic acid, may be substituted for citric acid. However more or less of another acid is normally required for the same result as obtained with citric acid, depending upon the particular acid used.

After connection of the piece 5 in the manner described in the solution, a voltage is applied from the voltage source 8 of between 4 and 15 volts to obtain a constant current of between .8 amp and 1.0 amp, depending upon the particular material being processed, the concentration of the solution and the object of the etching. This voltage is applied for a time period of between 15 seconds to approximately 10 minutes. With the ideal solution above in processing an N-P-N silicon transistor, a current of .8 amp for a period of 7 minutes may be applied. During this process and the application of the voltage, current flows down the electrode 6 and enters the piece 5 in the direction of the arrow A illustrated in FIG. 1. This current passes through the end layer and meeting the high inverse resistance of the layer 2, flows outwardly of the layer 1 generally in the direction of arrow B causing a peripheral layer, indicated at 12 by hatch lines, to be etched away.

After a desired amount of section 1 has been etched away, the piece 5 is removed for cleaning and further processing. During this etching process a very thin layer of dark stain is formed on the etched surface and base section 2. This dark stain may be easily removed by soaking in potassium hydroxide (cold solution). This solution may comprise, for example, 100 grams potassium hydroxide dissolved in 100 cc. water. The piece 5 is allowed to stand for approximately ten minutes for this removal. Alternately, a mild etch of $HF+HNO_3$ plus a modifier, e.g. acetic acid, may be used, in the following suggested ratios.

| | |
|---|---|
| HF | 1 part to 3 parts |
| $HNO_3$ | 3 parts to 10 parts |
| Acetic acid | 5 parts to 7 parts |

Following the removal, the piece 5 may be set in a jig and the section 1 may be ground down from end 14 to a desired distance from the surface 15 of section 2. The end of section 3 indicated at 16 may also be ground down in a suitable manner. Thus, surface 15 may serve as a reference surface or plane for the grinding or removing of the excess ends of the piece 5. This is particularly important at the collector end of the transistor to be formed. Following this grinding, connections may be fused to the emitter, based and collector of the piece by the usual and accepted methods.

It will be noted by this particular method, and with the elimination of a third electrode connected to the end 16 of the piece 5, a heavy deposit on the etched surfaces is avoided, such a heavy deposit being quite difficult to remove. Moreover, by the elimination of the third electrode, the operation is not as critical as it would otherwise be. Moreover, the operation allows considerable flexibility without loss of any material save that which it is desired to remove.

Figure 2:
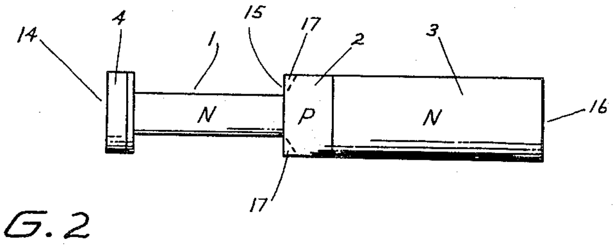
FIGURE 2 represents layers of semiconductor material after treatment with the process of the present invention.

It is often extremely critical that the reference plane 15 be flat and the section 2 be of uniform thickness. For this reason variations in the composition of the fluid 10 substantially beyond the limits set forth in the formulas above cause difficulty in the suitable treatment of the bar. Thus, if the citric acid is reduced too much below the suggested minimum, portions indicated in FIG. 2 at 17 may be etched away. In some instances, however, this may be useful, particularly where undercutting of the junction between the sections 1 and 2 is desired. Such an undercut may also be obtained by using acetic acid in relatively greater quantities than the corresponding amount of citric acid which is used. By varying the amount of hydrofluoric acid beyond the limitation set forth, the etching rate is affected. With a decrease in hydrofluoric acid the etching time becomes longer. Too much of a decrease will affect the geometry of the side section 1.

As a specific example of the present invention, a bar of silicon semiconductor material having successive layers of N-P-N type of silicon, a length of .160 inch and a diameter of .116 inch is secured between the electrodes 6 and 7 after a button 4 has been alloyed to one end of the bar in a manner as previously described. The solution 10 is of the first formula set forth above. The voltage which is applied is from a constant current source and is between 6 and 8 volts at the beginning of the etching process and between 12 and 14 volts at the end of the etching process. The etching current is maintained at .8 amp for a period of 7 minutes. It will be noted that the particular voltage and time for etching depend upon the area of the etched material and its volume. After the etching has been completed, the bar 5 is removed and is cleaned in a solution comprising a mixture of 100 cc. water and 100 grams potassium hydroxide for a period of ten minutes. Following this, the outer ends of the sections 1 and 3 are ground down to a selected height. An annular metallic base contact is then suitably fused to this surface. Electrodes are also connected to the ends 1 and 3 in a suitable and conventional manner.

As another embodiment of this invention, a rectangular bar, 15 mils in thickness by 212 and 360 mils, is to be etched at one end to a depth of 4 to 5 mils, approximately. The bar is secured between electrodes 6 and 7 in a solution comprising 20 grams of citric acid with hydrofluoric acid and water in the ratio of one part to six parts added to the citric acid to a total mixture of 300 cc. An initial voltage of 6 to 7 volts generating a current of .8 amp is applied in a period of 6 minutes. Normally 1½ minutes of etching time are allowed for each mil of thickness to be etched. The bar is then removed from the solution and treated in the manner set forth in the previous example. In this instance, however, the solution used for cleaning the dark stain may comprise a very mild solution of hydrofluoric, nitric and acetic acids in the ratios of one part, two parts and five parts by volume. With this solution the bar is submerged for a period of ten seconds. The bar is then removed and leads are connected in a manner as set forth in the previous example.

In addition to acetic and citric acid, mandelic, tartaric and maleic acid may be used in the same relative quantities and strength as acetic and citric acids. It has also been found that hydrochloric acid may be used with water alone. However this is much more difficult to control and clean. Consequently the combination of the organic acid, water and hydrofluric acid is preferred. It appears that the organic acid additives act as modifiers for shape control, and reducing the cleaning problem.

Having described my invention, I claim:

1. A method of etching one layer only of a piece of semiconductor silicon materials wherein said piece has a plurality of layers of donor and acceptor impurities comprising submerging said piece in a solution consisting essentially of hydrofluoric acid, water and an organic acid, wherein 400 cc. of said solution has between substantially 60 and 180 cc. hydrofluoric acid and 20 to 40 grams of organic acid selected from the group consisting of acetic acid, citric acid, mandelic acid, tartaric and maleic acid, securing one end layer only of said piece to a positive electrode substantially insulated from said solution with a negative electrode in said solution spaced from said piece, then passing a direct current of between .8 amp and 1.0 amp for at least 15 seconds through said positive electrode, piece, solution, and said negative electrode.

2. A method as set forth in claim 1 wherein a conductive button is soldered to said one layer and is positioned between said one layer and said positive electrode.

3. A method as set for in claim 1 wherein said piece is cleaned after etching by immersion in a solution of potassium hydroxide.

4. A method as set forth in claim 1 wherein said piece is cleaned after etching in a mild solution of hydrochloric acid, nitric acid, and a modifier.

5. A solution for use in electrolytically etching semiconductor materials consisting essentially of a ratio of 60 cc. to 180 cc. hydrofluoric acid, 20 to 40 grams of water soluble organic acid selected from one of a group consisting of acetic acid, citric acid, mandelic acid, tartaric acid and maleic acid, and sufficient water to make 400 cc. of a solution.

References Cited in the file of this patent

UNITED STATES PATENTS

| | | |
|---|---|---|
| 2,656,496 | Sparks | Oct. 20, 1953 |
| 2,802,159 | Stump | Aug. 6, 1957 |